United States Patent [19]

Sakurai et al.

[11] Patent Number: 5,283,544
[45] Date of Patent: Feb. 1, 1994

[54] MAGNETIC FIELD GENERATING DEVICE USED FOR MRI

[75] Inventors: Hideya Sakurai, Osaka; Masaaki Aoki, Amagasaki, both of Japan

[73] Assignee: Sumitomo Special Metals Co., Ltd., Osaka, Japan

[21] Appl. No.: 766,520

[22] Filed: Sep. 27, 1991

[30] Foreign Application Priority Data

Sep. 29, 1990 [JP] Japan .................. 2-261417
Sep. 29, 1990 [JP] Japan .................. 2-261418

[51] Int. Cl.$^5$ .................................. H01F 1/00
[52] U.S. Cl. .......................... 335/297; 335/299
[58] Field of Search ............ 335/296, 297, 298, 299; 325/318

[56] References Cited

U.S. PATENT DOCUMENTS

| | | | |
|---|---|---|---|
| 4,671,119 | 2/1987 | Moore | 335/297 |
| 4,758,813 | 7/1988 | Holsinger et al. | 335/296 |
| 4,818,966 | 4/1989 | Miyamoto et al. | 335/296 |
| 4,827,235 | 5/1989 | Inomata et al. | . |
| 4,887,059 | 12/1989 | Asano et al. | 335/296 |
| 5,061,897 | 10/1991 | Danby et al. | . |
| 5,124,651 | 6/1992 | Danby et al. | . |

Primary Examiner—Lincoln Donovan
Attorney, Agent, or Firm—Watson, Cole, Grindle & Watson

[57] ABSTRACT

A magnetic field generating device used for MRI includes a pair of magnetic pole pieces to each other to provide a gap therebetween and generate a magnetic field in the gap, the magnetic pole pieces being formed by laminating and integrating a plurality of non-oriented silicon steel sheets. By using laminated non-oriented silicon sheets the eddy current generated in the magnetic pole pieces caused by the application of GC pulses can be reduced and phenomenon of the residual magnetism can also be reduced.

17 Claims, 6 Drawing Sheets

PRIOR ART

MAGNETIC FIELD GENERATING DEVICE USED FOR MRI

BACKGROUND OF THE INVENTION

1. Field of the Invention

The present invention concerns a magnetic field generating device used, for example, in a magnetic resonance imaging apparatus (hereinafter referred to as MRI), particularly for medical use.

2. Description of the Prior Art

MRI is an apparatus adapted to obtain a tomographic image of a portion of a person and provide an image of his or her tissue.

In the magnetic field generating device used for the MRI, it is necessary that the provided gap have a space which is capable of partially or wholly accommodating the person to be diagnosed and it is also necessary to form a stable intense magnetic field, usually of 0.02 to 2.0 T and at an accuracy of less than $1 \times 10^{-4}$ in an image pick-up view field in the gap, i.e., in order to obtain a clear tomographic image.

A known magnetic field generating device used for MRI has a construction as shown in FIGS. 12(a) and 12(b) in which a pair of components 1, 1 made of permanent magnets are opposed to each other as a magnetic field generating source, with one end of each of them being secured with a magnetic pole piece 2 and the other ends of them are connected by means of yokes 3, to generate a static magnetic field in a gap 4 defined between the magnetic pole pieces 2 and 2.

An annular protrusion 5 is disposed at the periphery of each of the magnetic pole pieces 2, 2 in order to improve the uniformity of the magnetic field distribution in the gap 4, and it is usually made of a plate-shaped bulk (one piece product) prepared by scraping from magnetic material, such as electromagnetic soft iron or pure iron (refer to Japanese Patent Laid Open Sho 60-88407).

Gardient magnetic field coils 6 disposed in the vicinity of each of the magnetic pole pieces 2, 2 usually comprise three sets of coil groups corresponding to three directions X, Y and Z for obtaining positional information in the gap 4, but they are described simply in the drawing.

When a pulse current is applied to the gradient magnetic field coils 6, a gradient magnetic field changing with time in a trapezoidal waveform can be generated in a desired direction.

When the pulse current is caused to flow in the gradient magnetic field coils 6, since the magnetic pole pieces 2 are composed of the plate-shaped bulk as described above, magnetic the field changes abruptly upon rising and falling of the current to induce an eddy current in the magnetic pole piece 2, 2.

Since the eddy current forms a magnetic field in a direction opposite to the magnetic field formed with the gradient magnetic field coils 6, it takes a long time for the gradient magnetic field to reach a predetermined intensity.

As a means for overcoming the foregoing problem, there has been proposed a magnetic field generating device using, as the magnetic pole piece, a plate-shaped lamination comprising soft magnetic thin films, such as permalloy steel sheets or amorphous steel sheets, which are laminated such that the plane of lamination is in perpendicular to the plane of the magnetic pole pieces, and arranged and integrated in two layers such that the laminating directions are different by about 90° from each other (Japanese Patent Laid Open Sho 61-203605), or a magnetic field generating device using a magnetic powder of high specific resistivity (Japanese Patent Laid Open Sho 63-25907).

However, the construction described above, which is intended to reduce the eddy current, still involves a problem that the magnetic pole pieces are magnetized by the magnetic field formed with the gradient magnetic field coils (GC), and the uniformity of the magnetic field in the gap is distorted by the residual magnetism due to the magnetic hysteresis phenomenon (residual magnetism phenomenon) even after the interruption of the GC pulses due.

SUMMARY OF THE INVENTION

In view of the present situations described above for the magnetic pole pieces in the magnetic field generating device used for MRI, it is an object of the present invention to provide a magnetic pole pieces capable of reducing the formation of an eddy current, thereby increasing a gradient magnetic field to a predetermined intensity in a short period of time without deteriorating the uniformity of the magnetic field in a gap.

Another object of the present invention is to provide a magnetic pole pieces capable of reducing the phenomenon of residual magnetism, thereby obtaining a clear image with a high sensitivity.

A further object of the present invention is to provide a magnetic pole piece that can easily be fabricated and manufactured and which has high mechanical strength and excellent workability for easy assembling.

The present inventors have made various studies for attaining the foregoing objects in the magnetic field generating device used for MRI and, as a result, have found that the eddy current and the residual magnetism caused by the gradient magnetic field coils can be reduced without reducing the magnetic field intensity and the uniformity of the magnetic field by constructing a pair of magnetic pole pieces opposed to each other with a gap defined therebetween into a required shape, by laminating and integrating a plurality of non-oriented silicon steel sheets.

That is, the foregoing object can be attained in accordance with the present invention by a magnetic field generating device used for MRI, comprising a pair of magnetic pole pieces opposed to each other with a gap defined therebetween and generating a magnetic field in the gap, wherein the magnetic pole pieces are formed by laminating and integrating a plurality of non-oriented silicon steel sheets.

The direction of laminating the non-oriented silicon steel sheets according to in the present invention can be the opposing direction of the magnetic pole pieces, the direction perpendicular to the opposing direction of the magnetic pole pieces or a combination thereof.

In a preferred embodiment of the magnetic field generating device used for MRI according to the present invention, each magnetic pole comprises a plurality of block-shaped magnetic pole piece members or bar-shaped magnetic pole members (to be described later).

In particular, in a case of using the block-shaped magnetic pole pieces members, the entire mechanical strength of the magnetic pole pieces can be improved and handling for the magnetic pole piece can be facilitated by arranging a plurality of block-shaped magnetic pole piece members on a plate-shaped magnetic material base, to form a magnetic pole.

Further, in a case of using the bar-shaped magnetic pole members, assembling work can be facilitated by disposing a plurality of bar-shaped magnetic pole members so as to be suspended at the inside of a support frame and, further, since a required mechanical strength can be obtained without using the plate-shaped magnetic material base as described above, it can provide a particularly effective construction for the reduction of the residual magnetism.

Further, it has been found in accordance with the present invention that the uniformity of the magnetic field can further be improved in a construction in which the magnetic pole piece is formed by laminating the non-oriented silicon steel sheets, by disposing an annular protrusion comprising a magnetic material ring having at least one slit disposed in a diametrical direction at one or more positions on the side of the magnetic pole piece opposing to the gap.

The magnetic field generating device used for MRI as an object of the present invention is not restricted only to the embodiments to be described later but can be applied to any of construction so long as a pair of magnetic pole pieces are opposed to each other with a gap defined therebetween, for generating a magnetic field in the gap.

That is, the magnet component as the magnetic field generating source is not restricted only to a permanent magnet but an electromagnet or the like may also be used. Further, the magnetic pole piece may not necessarily be disposed directly to the magnetic component. Further, the shape, size or the like of the yoke for generating the magnetic paths in the gap by magnetically connecting the magnetic components with the pair of the magnetic pole pieces may also be selected properly depending on various properties such as the size of the gap required, magnetic field intensity, magnetic field uniformity or the like.

DESCRIPTION OF THE PREFERRED EMBODIMENTS

Figure 1A:
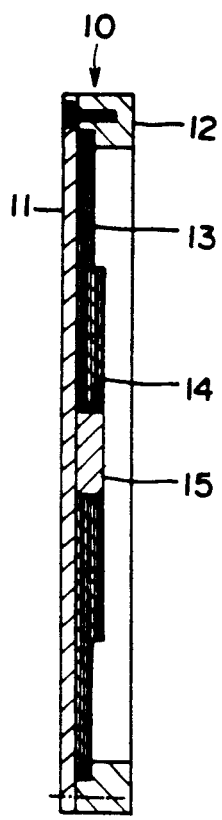
FIGS. 1a and 1b show a transversal cross sectional view illustrating and a plan view, respectively, of one embodiment of a magnetic pole piece in a magnetic field generating device used for MRI according to the present invention, this embodiment including block-shaped magnetic pole members comprising non-oriented silicon steel sheets laminated in an opposing direction to the magnetic poles.

Description will now be made to preferred embodiments of the magnetic field generating device used for MRI according to the present invention, in which a pair of permanent magnets are used as a magnetic field generating source.

As the permanent magnet for the magnet component used in the magnetic circuit, a ferrite magnet, a alnico magnet and a rare earth cobalt magnet can be used. In particular, the size of the magnet component can be reduced remarkably by using an R-Fe-B series permanent magnet that exhibits an extremely high energy product of greater than 30 MGOe, in which R represents light rare earth elements mainly composed of Nd or Pr abundant in view of resource and B and Fe are incorporated as the main ingredient.

The feature of the present invention resides in forming a magnetic pole piece by laminating and integrating a plurality of thin silicon steel sheets. The silicon steel sheets used herein are non-oriented silicon steel sheets with no directionality in the direction of the axis of easy magnetization (JIS C 2552, etc.), which has a particularly great effect of reducing the residual magnetism.

The thickness of the silicon steel sheets constituting the magnetic pole piece is optional. However, an excessive thickness is not preferred in view of the reduction of the eddy current, and in view of the fabricability, the thickness is desirably less than 1 mm. It is preferably selected from commercially available materials, for example, having thicknesses of 0.5 mm, 0.35 mm, etc.

The foregoing effect can be obtained by using the non-oriented silicon steel sheets but, if the silicon steel sheets are laminated only in one direction for the entire plate-shaped lamination that constitutes the magnetic pole piece as shown in the prior art (Japanese Patent Laid Open Sho 61-203605), the operation for laminating and integration becomes extremely complicated.

In view of the above, the present inventor proposes a construction which provides excellent workability for laminating and assembling, in which a plurality of block-shaped magnetic pole members are once formed each by laminating a plurality of rectangular non-oriented silicon steel sheets, each of a predetermined size, in the opposing direction of the magnetic pole pieces or in the direction perpendicular to the opposing direction of the magnetic pole pieces, and such a plurality of block-shaped magnetic pole members are secured directly to magnet components, or secured by way of a plate-shaped magnetic material base to the magnet components.

In particular, in a case where the laminating direction of the non-oriented silicon steel sheets is in the opposing direction of the magnetic pole pieces, they can be laminated and integrated with an extremely good workability.

The block-shaped magnetic pole members are disposed at least by two and the number of division blocks is determined depending on the shape and the size, required properties, assembling workability or the like of the magnetic pole pieces. For practical use, silicon steel sheets are laminated and integrated in a predetermined direction, and about 40 to 200 blocks of such block-shaped magnetic pole members, each cut into a square shape with a size for each side of about 50 mm, to 200 mm are preferably used to form the magnetic pole piece.

Further, an insulative layer is formed on the surface for each of the silicon steel sheets, so that they are electrically insulated from each other upon lamination and, further, each of the blocks can also be insulated electrically by integrating individual blocks using an insulative tape or insulative resin, to attain an effect of preventing the occurrence of an eddy current.

Further, by adjusting the thickness for each of the block-shaped magnetic pole members constituting the magnetic pole piece, a substantially convex projection or a protrusion of a trapezoidal cross section can be disposed at the central portion of the magnetic pole piece, thereby further improving the uniformity of the magnetic field (as shown in examples described later).

The block-shaped magnetic pole members may be disposed directly on the surface of the permanent magnet component opposing the gap, but the entire mechanical strength of the magnetic pole pieces can be improved, the handling made easy and the assembling operation for the magnetic circuit facilitated by disposing them on a plate-shaped magnetic material base described later.

By optimizing the ratio between the thickness for the magnetic material base and the thickness for the block-shaped magnetic pole members, the effects for making the magnetic field intensity uniform and preventing the eddy current and the residual magnetism that are required for the magnetic pole piece can be fully attained and, further, the mechanical strength of the magnetic pole piece comprising a plurality of block-shaped magnetic pole members can be compensated. Accordingly, the thickness of the magnetic material base should be selected properly so as to attain a required strength.

The material for the magnetic material base is preferably pure iron, low carbon steel (soft steel) or the like.

In addition to a construction using the block-shaped magnetic pole members as described above, another construction is also provided as shown below, in order to most effectively utilize the maximum lateral size of commercially available silicon steel sheet coils. At first a plurality of bar-shaped magnetic pole members are prepared by laminating a plurality of elongate rectangular non-oriented silicon steel sheets by a required number along the thickness of the sheet, and such a plurality of the bar-shaped magnetic pole members are integrated so as to be suspended while laminating in one direction on the inside of a ring-shaped support frame such that the laminating direction of them agrees with the direction perpendicular to the opposing direction of the magnetic pole pieces. The thickness of the bar-shaped magnetic pole member along the laminating direction is preferably from 30 mm to 100 mm in view of the mechanical strength, laminating workability or handling property.

In the present invention, the annular protrusion comprising the magnetic material ring disposed to the magnetic pole piece on the side opposing to the gap can be made of pure iron, low carbon steel (soft iron) or the like, and the protrusion may be disposed to the circumferential edge of the magnetic material base or the ring-shaped support frame, or directly disposed to the upper surface of the block-shaped magnetic pole members or the bar-shaped magnetic pole members or the like.

In any of the constructions described above, it is desirable to divide the annular protrusion by one or more slits with an aim of reducing the effect of the eddy current. It is also desirable to apply electric insulation between the magnetic material base or the ring-shaped support frame and the annular protrusion or between the magnetic material base or the ring-shaped support frame and the block-shaped magnetic pole members or the bar-shaped magnetic pole members.

Figure 1B:
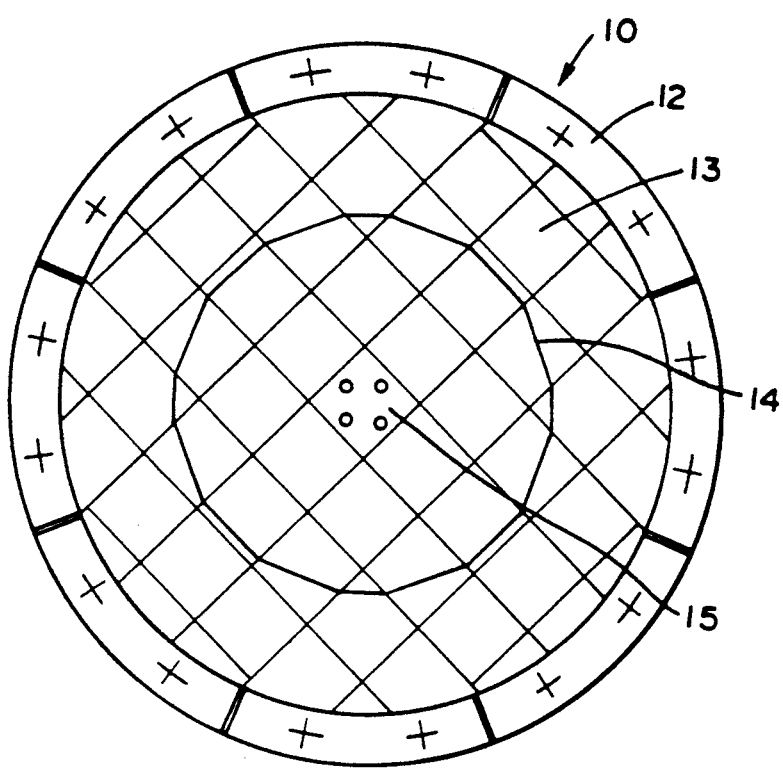

FIGS. 1(a) and 1(b) show a transversal cross sectional view and a top plan view of one embodiment of a magnetic pole piece in a magnetic field generating device used for MRI according to the present invention.

A magnetic pole piece 10 comprises a magnetic material base 11 consisting of a disk-shaped soft iron, a magnetic material ring 12 made of soft iron of a rectangular cross sectional shape disposed circumferentially along the periphery of the magnetic material base 11 and a plurality of block-shaped magnetic pole members 13 laid on the upper surface of the magnetic material base 11. The block-shaped magnetic pole members 13 are usually secured by means of synthetic resin adhesives to the magnetic material base 11.

The magnetic material ring 12 is made of soft iron of rectangular cross sectional shape disposed circumferentially along the periphery of the magnetic material base 11 and serves to make the height of the magnetic pole piece 10 on the side of the outer circumference higher than other portions and acts to concentrate magnetic fluxes to a required gap and improve the uniformity. The ring is secured to the magnetic material base 11 by means of bolts, with an insulative material disposed between the ring and the base. Further, the magnetic material ring 12 is divided circumferentially (divided into eight portions in the illustrated embodiment) to provide diametrical slits 16, thereby reducing the effect of the eddy current.

Figure 2:
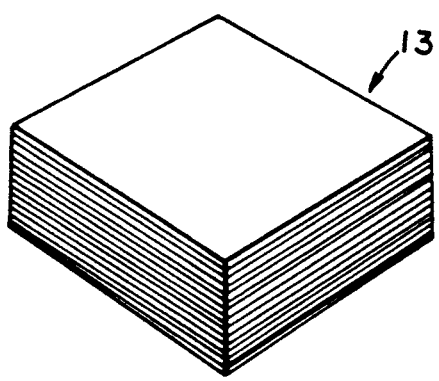
FIG. 2 is a perspective view illustrating an embodiment of a block-shaped magnetic pole member use in the magnetic pole piece shown in FIGS. 1a and 1b.

The block-shaped magnetic pole member 13 is constructed as shown in FIG. 2.

That is, the block-shaped magnetic pole member 13 is formed by merely laminating a plurality of non-oriented silicon steel sheets along the direction of their thickness, integrating them by impregnation of an insulative resin or the like to form a block-shaped magnetic pole member 13 of a predetermined thickness.

On the contrary, if oriented (anisotropic) silicon steel sheets are used for the silicon steel sheets, the coercive force in the rolling direction is extremely small, whereas the coercive force is increased in the direction perpendicular thereto (there is a difference of the coercive force by about one digit relative to that in the rolling direction). Accordingly, a difference is caused depending on the rolling direction also to the residual magnetism and the effect of reducing the residual magnetism becomes insufficient as a whole as compared with a construction using non-oriented silicon steel sheets. Further, in view of the effect on the uniformity of the magnetic field, it is necessary to make the rolling directions different 90° between each of the silicon steel sheets, which results in a drawback of complicating the laminating and integrating operation.

Such a plurality of block-shaped magnetic pole members 13 are arranged so as to form a substantially disk-shaped configuration as shown in FIG. 1. At the central portion of the surface of the magnetic pole piece 10 opposing to the gap, block-shaped magnetic pole members 13 of different thickness are used in order to form a convex projection 14 of a required diameter, and the uniformity of the magnetic field can be improved by the convex projection.

Further, a core 15 made of soft iron is disposed at the central portion of the magnetic material base 11 and this constitutes a substrate for mounting gradient magnetic field coils.

Figure 3A:
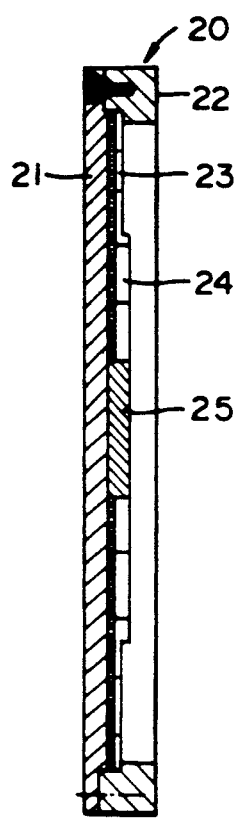
FIGS. 3a and 3b show a transversal cross sectional view and a plan view, respectively, of another embodiment of a magnetic pole piece in a magnetic field generating device used for MRI according to the present invention, this embodiment including a block-shaped magnetic pole members comprising non-oriented silicon steel sheets stacked perpendiculary to the opposing direction of the magnetic poles.
Figure 3B:
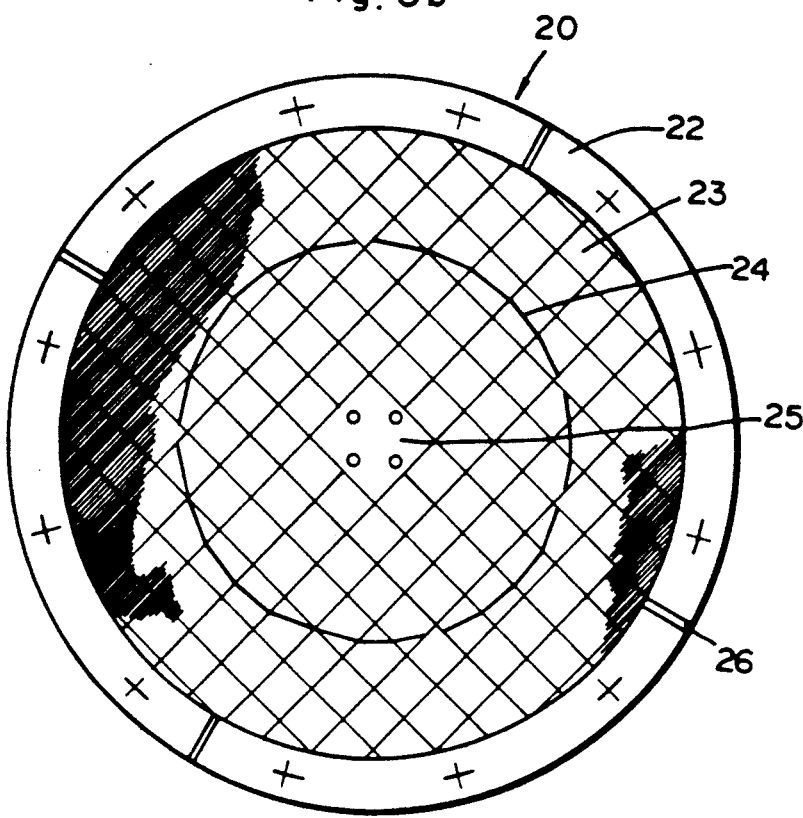

FIGS. 3(a) and 3(b) show a and a transversal cross sectional view and a top plan view of another embodiment of the magnetic pole piece in the magnetic field generating device used for MRI according to the present invention.

A magnetic pole piece 20 comprises a magnetic material base 21 consisting of a disk-shaped soft iron, a magnetic material ring 22 made of soft iron of a rectangular cross section disposed circumferentially along the periphery of the magnetic material base 21 and a plurality of block-shaped magnetic pole members 23 laid on the upper surface of the magnetic material base 21. The block-shaped magnetic pole members 23 are usually secured by means of synthetic resin adhesives to the magnetic material base 21.

The magnetic material ring 22 made of soft iron of a rectangular cross sectional shape disposed circumferential along the periphery of the magnetic material base 21 serves to make the height of the magnetic pole piece 20 on the side of the outer circumference higher than other portions, to concentrate magnetic fluxes to a required gap and improve the uniformity. The ring is secured to the magnetic material base 21 by means of bolts, with an insulative material disposed between the ring 22 and the base 21 and, further, the magnetic material ring 22 is divided circumferentially (divided into four portions in this embodiment) to provide diametrical slits 26, thereby reducing the effect of the eddy current.

Figure 4:
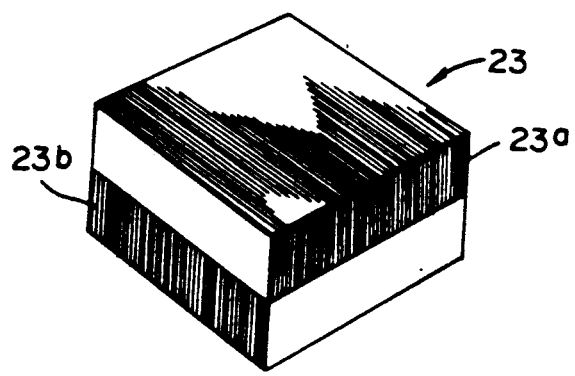
FIG. 4 is as perspective view of a block-shaped magnetic pole member used in the magnetic pole piece shown in FIG. 3.

The block-shaped magnetic pole member 23 is constructed as shown in FIG. 4.

That is, the block-shaped magnetic pole member 23 shown in FIG. 4 is prepared by forming small blocks 23a, 23b by laminating and integrating a plurality of non-oriented silicon steel sheets along the direction of their thickness and, thereafter, laminating the small blocks 23a, 23b into a predetermined thickness such that the laminating directions are different by 90° from each other in order to improve the uniformity of the magnetic field.

Further, it is preferred to select the thickness for each of the small blocks and constitute them in two or more layers depending on the workability for laminating and various properties demanded.

Such a plurality of block-shaped magnetic pole members 23 are arranged so as to form a substantially disk-like configuration as shown in FIG. 3. At the central portion of the surface of the magnetic pole piece 20 opposing to the gap, block-shaped magnetic pole members 23 of different thickness are used in order to form a convex projection 24 of a required diameter, so that the uniformity of the magnetic field can be improved by the convex projection.

Further, a core 25 made of soft iron is disposed at the central portion of the magnetic material base 21 and this constitutes a substrate for mounting the gradient magnetic field coil.

Figure 5:
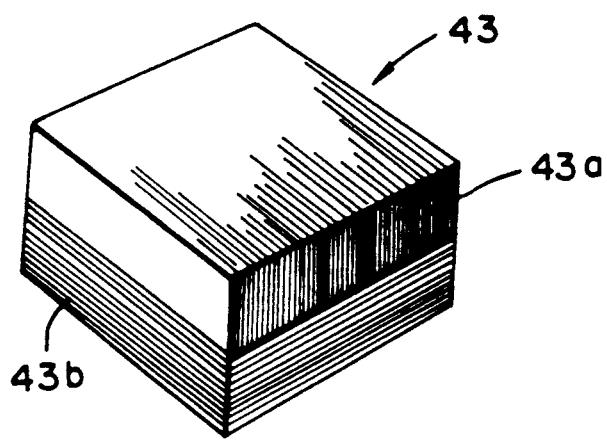
FIG. 5 is a perspective view of another embodiment of a block-shaped magnetic pole member.

FIG. 5 is a perspective view illustrating a further embodiment of the block-shaped magnetic pole member of the magnetic pole piece in accordance with the present invention.

The illustrated block-shaped magnetic pole member 43 comprises small blocks 43a, 43b, each having non-oriented steel silicon steel sheets laminated in different directions between the blocks and integrated to each other into a predetermined thickness.

That is, the small block 43a comprises a plurality of non-oriented silicon steel sheets laminated and integrated along the direction perpendicular to the opposing direction of the magnetic pole piece, whereas the small block 43b comprises a plurality of non-oriented silicon steel sheets laminated and integrated along the opposing direction of the magnetic pole piece.

The block-shaped magnetic pole member 43 can also be disposed in the same manner as the block-shaped magnetic pole piece member 13, 23 of the magnetic pole shown in FIG. 1 and FIG. 3.

The block-shaped magnetic pole member 13, 23 or 43 is desirably employed selectively, in view of the shape and the size of the magnetic pole piece, the shape and the size of the block-shaped magnetic pole member, required effects for reducing the eddy current and the residual magnetism and, further, the workability for stacking or the like.

The foregoing descriptions have been made to a case of constructing the magnetic pole piece by using a plurality of block-shaped magnetic pole members.

In a case of laminating and integrating the non-oriented silicon steel sheets along the direction identical with the opposing direction of the magnetic pole piece, if the surface area for each of the non-oriented silicon steel sheets is too large, the aimed effect of reducing the eddy current is deteriorated. Accordingly, using a block shape of a required size can be particularly effective.

Figure 6:
FIG. 6 is a perspective view of a strip of rectangular plate comprising non-oriented silicon steel sheets constituting the magnetic pole piece.

In a construction provided by laminating and integrating non-oriented silicon steel sheets, each comprising a strip of rectangular plate 50 as shown in FIG. 6, along the direction perpendicular to the opposing direction of the magnetic pole piece, since the thickness (T) is as thin as less than 1 mm, it is possible to attain the aimed effect of reducing eddy current, as well as the reducing the residual magnetism.

Construction of a magnetic pole piece with a diameter of about 1000 mm by using such thin sheets would result in a problem in view of the lamination and integrating operation, but use of a ring-shaped support frame, an appropriate jig or the like as described later for the embodiment shown in FIG. 7 enables mass production.

Figure 7A:
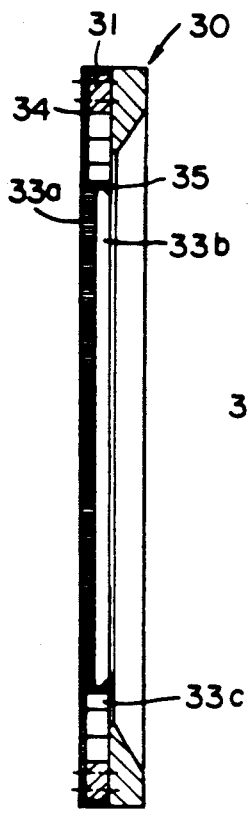
FIGS. 7a and 7b show a transversal cross sectional view and a top plan view, respectively, of a further embodiment of a magnetic pole piece in a magnetic field generating device used for MRI according to the present invention, illustrating bar-shaped magnetic part pole members comprising non-oriented steel silicon sheets laminated perpendicularly to the opposing direction of the magnetic pole pieces.
Figure 7B:
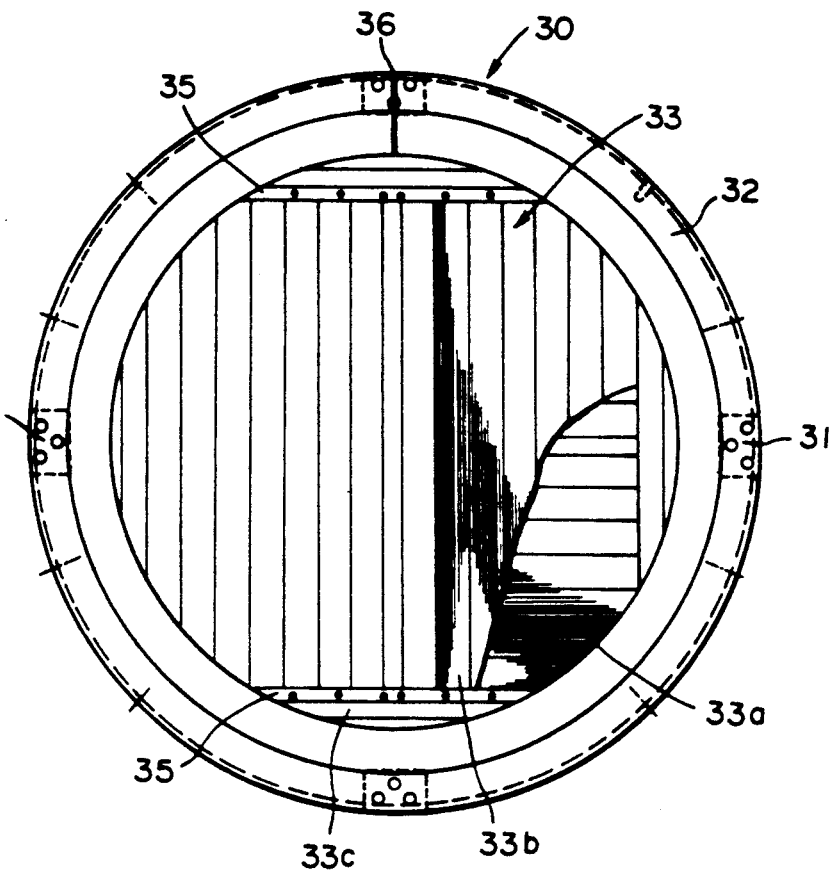

FIGS. 7(a) and 7(b) show and a transversal cross sectional view and a plan view of another embodiment of magnetic pole piece in the magnetic field generating device used for MRI according to the present invention.

This is a construction for most effectively utilizing the maximum lateral width of commercially available non-oriented silicon steel sheets.

That is, the maximum lateral width of a commercially available non-oriented silicon steel plate is 1220 mm and, if the outer diameter of the magnetic pole piece is greater than this, no magnetic pole piece of a required outer diametrical size can be obtained by merely laminating such non-oriented silicon steel sheets along the direction perpendicular to the opposing direction of the magnetic pole piece. Further, the number of the non-oriented silicon steel sheets exceeds 3000 and the operation for laminating and integrating them also becomes extremely troublesome.

Figure 8:
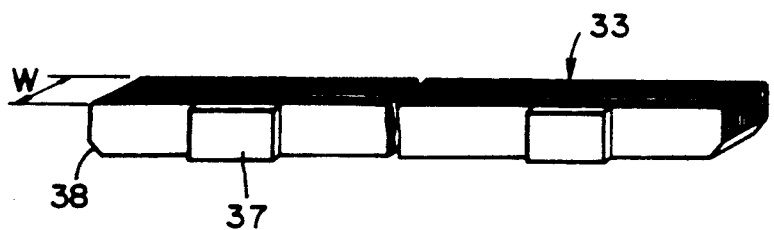
FIG. 8 is a perspective view of the bar-shaped magnetic pole member constituting the magnetic pole piece shown in FIG. 7.

A magnetic pole piece 30 shown in FIG. 7 has a feature of effectively utilizing a bar-shaped magnetic pole member 33 having an entire length which is equal with the maximum lateral size of a commercially available non-oriented silicon steel sheet coil as shown in FIG. 8.

The bar-shaped magnetic pole member 33 comprises a plurality of elongate rectangular non-oriented silicon steel sheets laminated along the direction of the steel sheet and integrated into a bar-shape of a predetermined width (W) by means of insulative adhesives.

Further, a chamfered portion 38 is formed to each of longitudinal ends of the bar-shaped magnetic pole member 33 for facilitating the disposition to a ring-shaped support frame 34 to be described later. Further, an insulative material 37 comprising, for example, an insulative adhesive tape made of a thin polyurethane tape or the like is appended at a predetermined position at least on one side of the bar-shaped magnetic pole member 33 for facilitating the integration of the magnetic pole piece by means of an insulative synthetic resin to be described later.

By using the insulative material 37 for the bar-shaped material, insulation can be made complete at least between the bars as compared with the case of merely laminating the silicon steel sheets and it can be said effective for the reduction of the eddy current.

Figure 9:
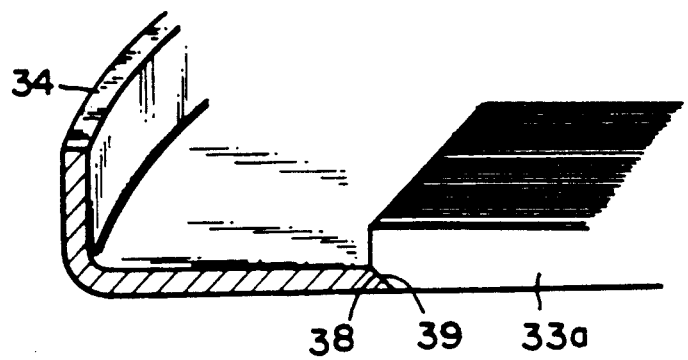
FIGS. 9 and 10 are explanatory views of details of the magnetic pole piece shown in FIG. 7.

A plurality of the thus constituted bar-shaped magnetic pole members 33 are arranged and mounted in one direction, with the laminating direction being in perpendicular to the opposing direction of the magnetic pole by means of a ring-shaped support frame 34 having an L-shaped cross sectional shape as shown in FIG. 9.

The plurality of the bar-shaped magnetic pole piece members 33 are arranged and mounted to the ring-shaped support frame 34 and, in order to much facilitate this, the central portion of the ring-shaped support frame 34 is cut out into a rectangular shape in this invention, so that the mounting can be completed by merely arranging the bar-shaped magnetic pole members 33a in one direction.

The rectangular inner circumferential edge of the frame formed by cutting out the ring-shaped support frame 34 is formed with a chamfered portion 39 similar to the chamfered portion 38 formed to the bar-shaped magnetic pole member 33a.

The foregoing embodiment illustrates a structure of mounting the bar-shaped magnetic pole member 33a by means of the chamfered portions 38, 39 for each of them, but the chamfered portions may be replaced with other mounting means such as fitting or the like.

Figure 10:
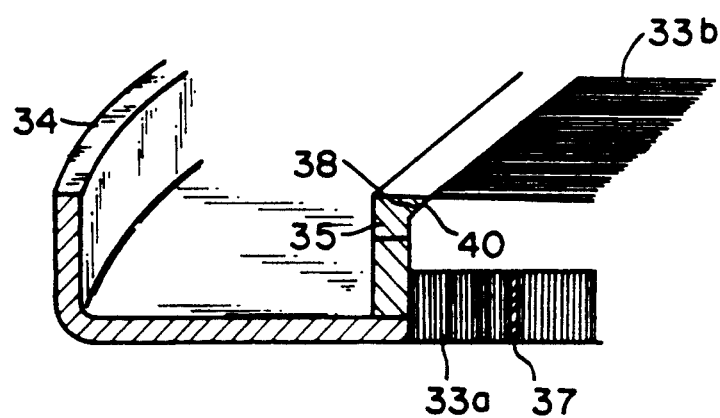
Figure 11:
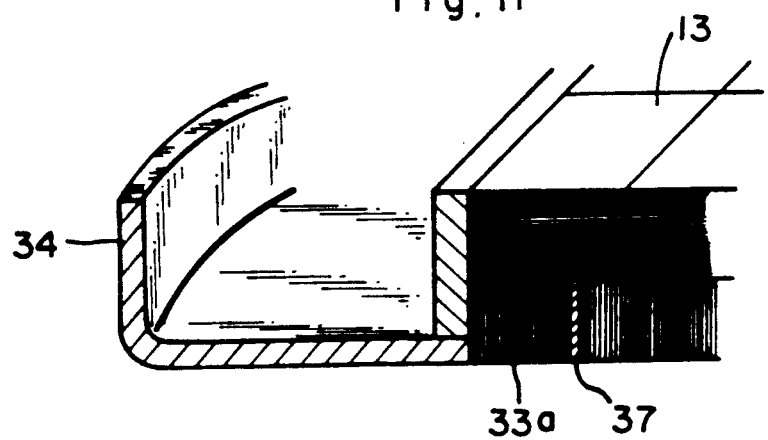
FIG. 11 is an explanatory view of details of another embodiment of the magnetic pole piece shown in FIG. 7.

Further, if the bar-shaped pole piece members 33 are laminated by two or more layers with their laminating directions being different by 90° in view of the further improvement for the uniformity of the magnetic field, a constitution as shown in FIG. 10 may be employed.

That is, the bar-shaped magnetic pole members 33a shown in FIG. 9 are used as the first layer and a plurality of bar-shaped magnetic pole members 33b constituting the second layer are further disposed on the upper surface of the first layer with the laminating direction being different by 90°. Further, the two layers of the bar-shaped magnetic pole members 33a and 33b are firmly secured by the ring-shaped support frame 34 by means of a fixing plate 35 having a chamfered portion 40 corresponding to the chamfered portion 38 formed on each of the ends of the bar-shaped magnetic pole members 33b at the second layer.

In a case of stacking two or more layers of the bar-shaped magnetic pole members 33 as described above, it is preferred to dispose an electrically insulative material such as made of an insulative adhesive tape at required positions between each of the layers.

By way of the foregoing steps, two layers of rectangular magnetic pole portions each side having a size identical with the maximum lateral size of the commercially available non-oriented silicon steel sheet is formed at the central portion of the magnetic pole 30.

Further, bar-shaped magnetic pole members 33c shorter than the length of the bar-shaped magnetic pole members 33a, 33b are disposed between the two-layered magnetic pole members and the inner circumferential surface of the ring-shaped support frame 34, to constitute a substantially disk-like magnet piece.

The shorter bar-shaped magnetic pole member 33c may have a two-layered structure in the same manner as the central portion of the magnetic pole piece, but the object of the present invention can be attained also with a single-layered structure.

A magnetic material ring 32 forming an annular protrusion is disposed to the magnetic pole piece 30 on the side opposing to the gap. The magnetic material ring 32 may be disposed directly on the upper surface of the bar-shaped magnetic pole members 33 but it is preferably disposed to the outer circumferential edge of the magnetic pole piece 30 by way of a plurality (four in the illustrated embodiment) of fixing blocks 31 disposed at required positions along the outer edge of the inner circumference of the ring-shaped support frame 34 as shown in FIG. 7.

By disposing diametrical slits 36 at 1 to 8 positions (at one position in the illustrated embodiment) to the magnetic material ring 32, the eddy current can be prevented. However, if the number of slits is increased, the ring is divided excessively making the assembling operation complicated.

After forming the magnetic pole 30 by assembling each of the members as described specifically above, when an insulative synthetic resin such as an epoxy resin is cast from the upper surface of the magnetic pole piece 30, the insulative synthetic resin is filled through out the entire portion of the magnetic pole piece 30 by way of fine gaps formed with the insulative material 37 appended to each of the bar-shaped magnetic pole members 33 and the insulative material appended between each of the layers, so that each of the bar-shaped magnetic pole members 33 are bonded and integrated in a state being insulated from each other and a mechanical strength required as the magnetic pole piece can be ensured.

In the above-mentioned construction, since there is no requirement for disposing the magnetic material base below the bar-shaped magnetic pole members 33, the effect of disposing the non-oriented silicon steel sheets can be attained effectively, and the effect of reducing the eddy current and the residual magnetism phenomenon is more excellent than that obtained with construction comprising a combination of the block-shaped magnetic pole members 13 or 23 with the magnetic material base 21 or 22 of FIG. 1 or 3.

In the magnetic pole piece 30 in FIG. 7, the bar-shaped magnetic pole members 33b constituting the upper surface of the magnetic pole may be replaced, if necessary, with the block-shaped magnetic pole member 13, 23 or 43 as shown in FIG. 10 (FIG. 10 shows a constitution of disposing the block-shaped magnetic pole member 13), the purpose of the present invention can also be attained. Further, as has been described above, the strip of rectangular sheet 50 shown in FIG. 6 may also be used directly without using the bar-shaped magnetic pole piece member 33.

When the magnetic pole 10, 20 or 30 having the construction as described above is used in the magnetic field generating device used for MRI, the non-oriented silicon steel sheets have a high saturation magnetic flux density (BS), and the magnetic field can be easily made uniform in the gap. Further, since a plurality of thin sheets each with a low coercive force (Hc) (hysteresis loss) and electrically insulated from each other are laminated in this constitution, an eddy current caused to the magnetic pole piece is reduced even when GC pulses are applied to the gradient magnetic field coils and it is also possible to reduce the residual magnetism.

EXAMPLE 1

In a magnetic field generating device used for MRI having the same structure as that in FIG. 12, R-Fe-B series permanent magnets having (BH)max of 40 MGOe were used, block-shaped magnetic pole members of a construction shown in FIG. 2 comprising non-oriented silicon steel sheets having the properties as described below were laid on a magnetic material base made of soft iron having the properties as described below, and an annular protrusion made of soft iron (slit at four positions) was disposed to form a pair of magnetic pole pieces shown in FIG. 1, with an opposing gap being set to 500 mm.

The magnetic material base had an outer diameter of 1050 mm and a thickness of 25 mm.

Further, the thickness of the various magnetic pole members after disposing on the magnetic material base (maximum thickness) was set to 25 mm. The thickness of the non-oriented silicon steel sheet was set to 0.35 mm. A square sheet sized 100 mm in each of sides was mainly used for non-oriented silicon steel sheet.

The magnetic material base and the non-oriented silicon steel sheets had the coercive force (Hc), saturated magnetic flux density (Bs) and the specific resistivity ($\rho$) as shown below.

Magnetic material base (soft iron):
Hc=80 A/m
Bs=2.0 T
$\rho = 1 \times 10^{-4} \Omega m$.
Non-oriented silicon steel sheet:
Hc=40 A/m
Bs=1.7 T
$\rho = 4.5 \times 10^{-8} \Omega m$.

EXAMPLE 2

Figure 12A:
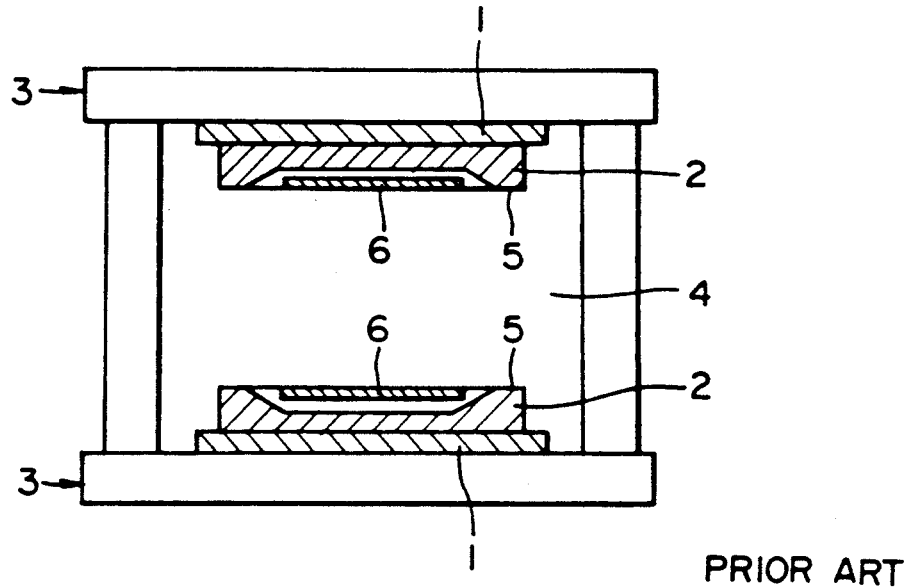
FIGS. 12a and 12b show a longitudinal cross sectional view and a transversal cross sectional view of a known magnetic field generating device used for MRI.
Figure 12B:
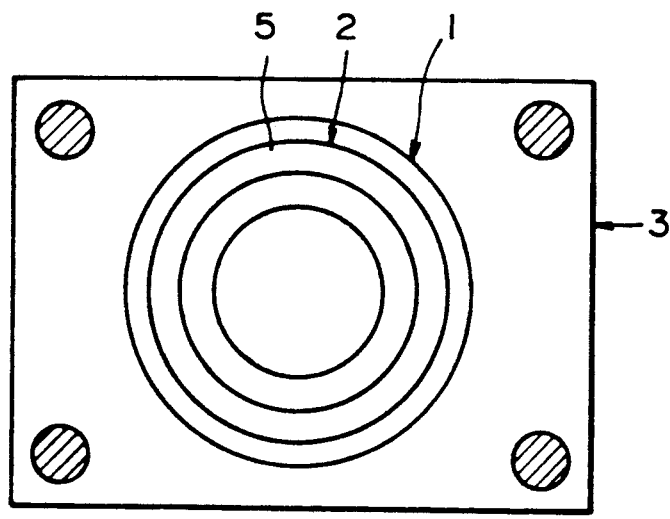

In a magnetic field generating device used for MRI having the same structure as that in FIG. 12, an R-Fe-B series permanent magnets having (BH)max of 40 MGOe were used, block-shaped magnetic pole members of a construction shown in FIG. 4 comprising non-oriented silicon steel sheets were laid on a magnetic material base made of soft iron and an annular protrusions made of soft iron (slit at four positions) was disposed to form a pair of magnetic pole pieces shown in FIG. 3, with an opposing gap being set to 500 mm.

The non-oriented silicon steel sheets were mainly rectangular sheets of 15 mm height × 100 mm width, and they were formed into two-layered square blocks sized 100 mm for each side. Other conditions were the same as those in Example 1.

EXAMPLE 3

In a magnetic field generating device used for MRI having the same structure as that in FIG. 12, an R-Fe-B series permanent magnets having (BH)max 40 of MGOe were used, bar-shaped magnetic pole members of a construction shown in FIG. 7 comprising non-oriented silicon steel sheets were laid on a ring-shaped support frame made of soft iron and an annular protrusions made of soft iron (slit at four positions) was disposed to form a pair of magnetic pole pieces each of 1050 mm outer diameter, shown in FIG. 7 with the gap between them being set to 500 mm.

The bar-shaped magnetic pole members disposed at the central portion of the magnetic pole piece had a size of 700 mm length 33 50 mm width × 20 mm height and they were disposed in two layers as shown in FIG. 10. The material for the ring-shaped support frame was identical with that for the magnetic material base of Example 1. Other conditions were identical with those of Example 1.

COMPARATIVE EXAMPLE 1

A magnetic field generating device used for MRI was assembled quite in the same construction as that of Example 1 by construction the block-shaped magnetic pole members as shown in FIG. 2 by using non-oriented silicon steel sheets having the properties described below.

The oriented silicon steel sheets had coercive force (Hc), a saturation magnetic flux density (Bs) and a specific resistivity ($\rho$), respectively, as shown below.
Oriented silicon steel sheet:
Hc=4.8 A/m
Bs=1.8 T
$\rho = 48 \times 10^{-8} \Omega m$.

COMPARATIVE EXAMPLE 2

A magnetic field generating device used for MRI was assembled with in the same construction as that in Example 1 except for constructing the magnetic pole with the same size and the same shape from the bulk material made of the same soft iron as the base.

In the magnetic field generating devices used for MRI of Examples 1 to 3 and Comparative Examples 1 and 2 shown below, measurement was conducted for the uniformity of the magnetic field, the magnetic field intensity and the effect of reducing the eddy current caused by the gradient magnetic field coils, as well as, the residual magnetism caused by GC pulses.

As a result, uniformity of the magnetic field of 30 ppm and the magnetic field intensity of 0.2 T were obtained as measured values in the measuring space within a radius of 200 mm from the center of the gap both in Examples 1 to 3 and Comparative Examples 1 and 2.

The results of the measurement for the eddy current and the residual magnetism are shown in Table 1. The eddy current was evaluated by the magnetic field intensity ratio when a sinusoidal wave at 100 Hz was given, while assuming the intensity of the gradient magnetic field given by a direct current as 1 (greater value is better), and the residual magnetism is represented by a relative ratio assuming the residual magnetism as 1 in the constitution of Comparative Example 2 (change of the uniformity).

TABLE 1

|  | Example | | | Comparative Example | |
| --- | --- | --- | --- | --- | --- |
|  | 1 non-oriented sheet FIG. 1 | 2 Si steel FIG. 3 | 3 Si steel FIG. 7 | 1 Oriented steel | 2 Si Bulk FIG. 12 |
| Eddy current | 0.8 | 0.8 | 0.95 | 0.8 | 0.2 |
| Residual magnetism | 0.5 | 0.5 | 0.3 | 0.8 | 1 |

As apparent from the examples, when the magnetic pole pieces comprising a plurality of block-shaped or bar-shaped magnetic pole members formed by laminating and integrating a plurality of non-oriented steel sheets are used for the magnetic field generating device used for MRI, the magnetic field in the gap can be made uniform and there can be obtained effects of reducing the eddy current caused by the gradient field coils, as well as reducing the residual magnetism caused by GC pulses.

We claim:

1. A magnetic field generating device for MRI which comprises a pair of magnetic pole pieces mounted opposite one another so as to form a gap therebetween, said magnetic pole pieces being capable of generating a magnetic field in said gap, each magnetic pole piece including a plurality of magnetic pole members arranged to confront said gap, each magnetic pole member comprising a plurality of non-oriented silicon steel sheets laminated and connected together.

2. A magnetic field generating device for MRI as defined in claim 1, wherein said magnetic pole members are block shaped.

3. A magnetic field generating device for MRI as defined in claim 2, wherein said magnetic pole pieces define an opposing direction and said non-oriented silicon steel sheets of the block-shaped magnetic pole members are laminated in parallel with said opposing direction.

4. A magnetic field generating device for MRI as defined in claim 2, wherein said magnetic pole pieces define an opposing direction and said non-oriented silicon steel sheets are laminated perpendicularly to said opposing direction.

5. A magnetic field generating device for MRI as defined in claim 4, wherein each block-shaped magnetic pole piece member comprises first and second layers and the non-oriented silicon steel sheets of the second layer are laminated at a 90° angle to the non-oriented silicon steel sheets of the first layer.

6. A magnetic field generating device used for MRI as defined in claim 2, wherein each block-shaped magnetic pole member comprises first and second layers, the direction of lamination of the non-oriented silicon steel sheets in said first layer being parallel with the opposing direction of the magnetic pole pieces, while the direction of lamination of the non-oriented silicon steel sheets in the second layer being perpendicular to the opposing direction of the magnetic pole pieces.

7. A magnetic field generating device for MRI as defined in claim 2, wherein each magnetic pole piece includes a plate-shaped magnetic material base on which said block-shaped magnetic pole members are positioned.

8. A magnetic field generating device for MRI as defined in claim 1, wherein said non-oriented silicon steel sheets each comprises a strip of rectangular sheet and they are laminated and integrated along the direction perpendicular to the opposing direction of magnetic pole pieces.

9. A magnetic field generating device for MRI as defined in claim 8, wherein each magnetic pole piece comprises a plurality of bar-shaped magnetic pole members formed by laminating and integrating non-oriented silicon steel sheets each in the form of a strip of rectangular sheet along the direction perpendicular to the opposing direction of the magnetic pole piece.

10. A magnetic field generating device for MRI as defined in claim 9, wherein the bar-shaped magnetic piece members are laminated and integrated into two layers and disposed such that the direction of laminating the non-oriented silicon steel sheets constituting each of the layers is different by 90° from each other.

11. A magnetic field generating device for MRI as defined in claim 9, including a ring-shaped support frame which surrounds said bar-shaped magnetic pole members.

12. A magnetic field generating device used for MRI as defined in claim 1, wherein each magnetic pole piece comprises a plurality of block-shaped magnetic pole members formed by laminating and integrating a plurality of non-oriented silicon steel sheets and arranged and disposed on a layer formed by arranging and disposing a plurality of bar-shaped magnetic pole members formed by laminating and integrating a plurality of non-oriented silicon steel sheets each comprising a strip of rectangular sheet along the direction in perpendicular to an opposing direction of the magnetic pole pieces.

13. A magnetic field generating device for MRI as defined in claim 1, wherein the thickness of the non-oriented silicon steel sheets is less than 1.0 mm.

14. A magnetic field generating device for MRI as defined in claim 2, wherein each of main block-shaped magnetic pole members comprises a square sheet each side sized from 50 mm to 200 mm.

15. A magnetic field generating device for MRI as defined in claim 9, wherein the thickness of each of the bar-shaped magnetic pole members in the laminating direction is from 30 mm to 100 mm.

16. A magnetic field generating device for MRI as defined in claim 1, including an annular protrusion comprising a magnetic material ring having diametrical slits at one or more positions confronts said gap.

17. A magnetic field generating device for MRI according to claim 1, wherein each magnetic pole piece is generally circular.

* * * * *